(12) United States Patent
Shifren et al.

(10) Patent No.: US 9,508,800 B2
(45) Date of Patent: Nov. 29, 2016

(54) ADVANCED TRANSISTORS WITH PUNCH THROUGH SUPPRESSION

(71) Applicant: Mie Fujitsu Semiconductor Limited, Kuwana (JP)

(72) Inventors: Lucian Shifren, San Jose, CA (US); Pushkar Ranade, Los Gatos, CA (US); Paul E. Gregory, Palo Alto, CA (US); Sachin R. Sonkusale, Los Gatos, CA (US); Weimin Zhang, San Jose, CA (US); Scott E. Thompson, Gainesville, FL (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 0 days.

(21) Appl. No.: 14/977,887

(22) Filed: Dec. 22, 2015

(65) Prior Publication Data

US 2016/0181370 A1 Jun. 23, 2016

Related U.S. Application Data

(60) Division of application No. 14/188,218, filed on Feb. 24, 2014, now Pat. No. 9,263,523, which is a division of application No. 13/787,073, filed on Mar. 6, 2013, now abandoned, which is a continuation of application (Continued)

(51) Int. Cl.
*H01L 29/10* (2006.01)
*H01L 27/092* (2006.01)

(Continued)

(52) U.S. Cl.
CPC ..... *H01L 29/1083* (2013.01); *H01L 21/82345* (2013.01); *H01L 21/823412* (2013.01);

(Continued)

(58) Field of Classification Search
CPC ........... H01L 21/823412; H01L 29/36; H01L 21/823493; H01L 27/088; H01L 29/1083; H01L 29/66537; H01L 29/7836; H01L 29/78; H01L 29/1045; H01L 29/7816; H01L 29/7833; H01L 27/092; H01L 29/0847; H01L 29/1033; H01L 21/82345
USPC ....................................................... 257/369
See application file for complete search history.

(56) References Cited

U.S. PATENT DOCUMENTS 3,958,266 A 5/1976 Athanas
4,000,504 A 12/1976 Berger (Continued)

FOREIGN PATENT DOCUMENTS

CN 200910109443.3 8/2009
CN 101661889 9/2011

(Continued)

OTHER PUBLICATIONS

US 7,011,991, 3/2006, Li (withdrawn).

(Continued)

*Primary Examiner* — Walter H Swanson
(74) *Attorney, Agent, or Firm* — Baker Botts L.L.P.

(57) ABSTRACT

An advanced transistor with punch through suppression includes a gate with length Lg, a well doped to have a first concentration of a dopant, and a screening region positioned under the gate and having a second concentration of dopant. The second concentration of dopant may be greater than $5\times10^{18}$ dopant atoms per $cm^3$. At least one punch through suppression region is disposed under the gate between the screening region and the well. The punch through suppression region has a third concentration of a dopant intermediate between the first concentration and the second concentration of dopant. A bias voltage may be applied to the well region to adjust a threshold voltage of the transistor.

18 Claims, 5 Drawing Sheets

Related U.S. Application Data

No. 12/895,813, filed on Sep. 30, 2010, now Pat. No. 8,421,162, and a continuation-in-part of application No. 12/708,497, filed on Feb. 18, 2010, now Pat. No. 8,273,617.

(60) Provisional application No. 61/247,300, filed on Sep. 30, 2009, provisional application No. 61/262,122, filed on Nov. 17, 2009, provisional application No. 61/357,492, filed on Jun. 22, 2010.

(51) Int. Cl.
| | |
|---|---|
| H01L 29/08 | (2006.01) |
| H01L 29/36 | (2006.01) |
| H01L 21/8234 | (2006.01) |
| H01L 27/088 | (2006.01) |
| H01L 29/66 | (2006.01) |
| H01L 29/78 | (2006.01) |

(52) U.S. Cl.
CPC ..... *H01L21/823493* (2013.01); *H01L 27/088* (2013.01); *H01L 27/092* (2013.01); *H01L 29/0847* (2013.01); *H01L 29/1033* (2013.01); *H01L 29/1045* (2013.01); *H01L 29/36* (2013.01); *H01L 29/66537* (2013.01); *H01L 29/78* (2013.01); *H01L 29/7816* (2013.01); *H01L 29/7833* (2013.01); *H01L 29/7836* (2013.01)

(56) References Cited

U.S. PATENT DOCUMENTS

| | | |
|---|---|---|
| 4,021,835 A | 5/1977 | Etoh |
| 4,242,691 A | 12/1980 | Kotani |
| 4,276,095 A | 6/1981 | Beilstein, Jr. |
| 4,315,781 A | 2/1982 | Henderson |
| 4,518,926 A | 5/1985 | Swanson |
| 4,559,091 A | 12/1985 | Allen |
| 4,578,128 A | 3/1986 | Mundt |
| 4,617,066 A | 10/1986 | Vasudev |
| 4,662,061 A | 5/1987 | Malhi |
| 4,761,384 A | 8/1988 | Neppl |
| 4,780,748 A | 10/1988 | Cunningham |
| 4,819,043 A | 4/1989 | Yazawa |
| 4,885,477 A | 12/1989 | Bird |
| 4,908,681 A | 3/1990 | Nishida |
| 4,945,254 A | 7/1990 | Robbins |
| 4,956,311 A | 9/1990 | Liou |
| 5,034,337 A | 7/1991 | Mosher |
| 5,144,378 A | 9/1992 | Hikosaka |
| 5,156,989 A | 10/1992 | Williams |
| 5,156,990 A | 10/1992 | Mitchell |
| 5,166,765 A | 11/1992 | Lee |
| 5,208,473 A | 5/1993 | Komori |
| 5,294,821 A | 3/1994 | Iwamatsu |
| 5,298,763 A | 3/1994 | Shen |
| 5,369,288 A | 11/1994 | Usuki |
| 5,373,186 A | 12/1994 | Schubert |
| 5,384,476 A | 1/1995 | Nishizawa |
| 5,426,328 A | 6/1995 | Yimaz |
| 5,444,008 A | 8/1995 | Han |
| 5,552,332 A | 9/1996 | Tseng |
| 5,559,368 A | 9/1996 | Hu |
| 5,594,264 A | 1/1997 | Shirahata et al. |
| 5,608,253 A | 3/1997 | Liu |
| 5,622,880 A | 4/1997 | Burr |
| 5,624,863 A | 4/1997 | Helm |
| 5,625,568 A | 4/1997 | Edwards |
| 5,641,980 A | 6/1997 | Yamaguchi |
| 5,663,583 A | 9/1997 | Matloubian |
| 5,712,501 A | 1/1998 | Davies |
| 5,719,422 A | 2/1998 | Burr |
| 5,726,488 A | 3/1998 | Watanabe |
| 5,726,562 A | 3/1998 | Mizuno |
| 5,731,626 A | 3/1998 | Eaglesham |
| 5,736,419 A | 4/1998 | Naem |
| 5,753,555 A | 5/1998 | Hada |
| 5,754,826 A | 5/1998 | Gamal |
| 5,756,365 A | 5/1998 | Kakumu |
| 5,763,921 A | 6/1998 | Okumura |
| 5,780,899 A | 7/1998 | Hu |
| 5,847,419 A | 12/1998 | Imai |
| 5,856,003 A | 1/1999 | Chiu |
| 5,861,334 A | 1/1999 | Rho |
| 5,877,049 A | 3/1999 | Liu |
| 5,885,876 A | 3/1999 | Dennen |
| 5,889,315 A | 3/1999 | Farrenkopf |
| 5,895,954 A | 4/1999 | Yasumura |
| 5,899,714 A | 5/1999 | Farremkopf |
| 5,918,129 A | 6/1999 | Fulford, Jr. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin |
| 5,985,705 A | 11/1999 | Seliskar |
| 5,989,963 A | 11/1999 | Luning |
| 6,001,695 A | 12/1999 | Wu |
| 6,020,227 A | 2/2000 | Bulucea |
| 6,043,139 A | 3/2000 | Eaglesham |
| 6,060,345 A | 5/2000 | Hause |
| 6,060,364 A | 5/2000 | Maszara |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son |
| 6,121,153 A | 9/2000 | Kikkawa |
| 6,124,156 A * | 9/2000 | Widmann ......... H01L 21/76294 257/E21.571 |
| 6,147,383 A | 11/2000 | Kuroda |
| 6,153,920 A | 11/2000 | Gossmann |
| 6,157,073 A | 12/2000 | Lehongres |
| 6,175,582 B1 | 1/2001 | Naito |
| 6,184,112 B1 | 2/2001 | Maszara |
| 6,190,979 B1 | 2/2001 | Radens |
| 6,194,259 B1 | 2/2001 | Nayak |
| 6,198,157 B1 | 3/2001 | Ishida |
| 6,218,892 B1 | 4/2001 | Soumyanath |
| 6,218,895 B1 | 4/2001 | De |
| 6,221,724 B1 | 4/2001 | Yu |
| 6,229,188 B1 | 5/2001 | Aoki |
| 6,232,164 B1 | 5/2001 | Tsai |
| 6,235,597 B1 | 5/2001 | Miles |
| 6,245,618 B1 | 6/2001 | An |
| 6,268,640 B1 | 7/2001 | Park |
| 6,271,070 B2 | 8/2001 | Kotani |
| 6,271,551 B1 | 8/2001 | Schmitz |
| 6,288,429 B1 | 9/2001 | Iwata |
| 6,297,132 B1 | 10/2001 | Zhang |
| 6,300,177 B1 | 10/2001 | Sundaresan |
| 6,313,489 B1 | 11/2001 | Letavic |
| 6,319,799 B1 | 11/2001 | Ouyang |
| 6,320,222 B1 | 11/2001 | Forbes |
| 6,323,525 B1 | 11/2001 | Noguchi |
| 6,326,666 B1 | 12/2001 | Bernstein |
| 6,335,233 B1 | 1/2002 | Cho |
| 6,358,806 B1 | 3/2002 | Puchner |
| 6,380,019 B1 | 4/2002 | Yu |
| 6,391,752 B1 | 5/2002 | Colinge |
| 6,426,260 B1 | 7/2002 | Hshieh |
| 6,426,279 B1 | 7/2002 | Huster |
| 6,432,754 B1 | 8/2002 | Assaderaghi |
| 6,444,550 B1 | 9/2002 | Hao |
| 6,444,551 B1 | 9/2002 | Ku |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall |
| 6,482,714 B1 | 11/2002 | Hieda |

(56) References Cited

U.S. PATENT DOCUMENTS

| | | |
|---|---|---|
| 6,489,224 B1 | 12/2002 | Burr |
| 6,492,232 B1 | 12/2002 | Tang |
| 6,500,739 B1 | 12/2002 | Wang |
| 6,501,131 B1 | 12/2002 | Divakaruni |
| 6,503,801 B1 | 1/2003 | Rouse |
| 6,503,805 B2 | 1/2003 | Wang |
| 6,506,640 B1 | 1/2003 | Ishida |
| 6,518,623 B1 | 2/2003 | Oda |
| 6,521,470 B1 | 2/2003 | Lin |
| 6,534,373 B1 | 3/2003 | Yu |
| 6,541,328 B2 | 4/2003 | Whang |
| 6,541,829 B2 | 4/2003 | Nishinohara |
| 6,548,842 B1 | 4/2003 | Bulucea |
| 6,551,885 B1 | 4/2003 | Yu |
| 6,552,377 B1 | 4/2003 | Yu |
| 6,573,129 B2 | 6/2003 | Hoke |
| 6,576,535 B2 | 6/2003 | Drobny |
| 6,600,200 B1 | 7/2003 | Lustig |
| 6,620,671 B1 | 9/2003 | Wang |
| 6,624,488 B1 | 9/2003 | Kim |
| 6,627,473 B1 | 9/2003 | Oikawa |
| 6,630,710 B1 | 10/2003 | Augusto |
| 6,660,605 B1 | 12/2003 | Liu |
| 6,662,350 B2 | 12/2003 | Fried |
| 6,667,200 B2 | 12/2003 | Sohn |
| 6,670,260 B1 | 12/2003 | Yu |
| 6,693,333 B1 | 2/2004 | Yu |
| 6,730,568 B2 | 5/2004 | Sohn |
| 6,737,724 B2 | 5/2004 | Hieda |
| 6,743,291 B2 | 6/2004 | Ang |
| 6,743,684 B2 | 6/2004 | Liu |
| 6,751,519 B1 | 6/2004 | Satya |
| 6,753,230 B2 | 6/2004 | Sohn |
| 6,760,900 B2 | 7/2004 | Rategh |
| 6,770,944 B2 | 8/2004 | Nishinohara |
| 6,787,424 B1 | 9/2004 | Yu |
| 6,797,553 B2 | 9/2004 | Adkisson |
| 6,797,602 B1 | 9/2004 | Kluth |
| 6,797,994 B1 | 9/2004 | Hoke |
| 6,808,004 B2 | 10/2004 | Kamm |
| 6,808,994 B1 | 10/2004 | Wang |
| 6,813,750 B2 | 11/2004 | Usami |
| 6,821,825 B2 | 11/2004 | Todd |
| 6,821,852 B2 | 11/2004 | Rhodes |
| 6,822,297 B2 | 11/2004 | Nandakumar |
| 6,831,292 B2 | 12/2004 | Currie |
| 6,835,639 B2 | 12/2004 | Rotondaro |
| 6,852,602 B2 | 2/2005 | Kanzawa |
| 6,852,603 B2 | 2/2005 | Chakravarthi |
| 6,881,641 B2 | 4/2005 | Wieczorek |
| 6,881,987 B2 | 4/2005 | Sohn |
| 6,891,439 B2 | 5/2005 | Jachne |
| 6,893,947 B2 | 5/2005 | Martinez |
| 6,900,519 B2 | 5/2005 | Cantell |
| 6,901,564 B2 | 5/2005 | Stine |
| 6,916,698 B2 | 7/2005 | Mocuta |
| 6,917,237 B1 | 7/2005 | Tschanz |
| 6,927,463 B2 | 8/2005 | Iwata |
| 6,928,128 B1 | 8/2005 | Sidiropoulos |
| 6,930,007 B2 | 8/2005 | Bu |
| 6,930,360 B2 | 8/2005 | Yamauchi |
| 6,957,163 B2 | 10/2005 | Ando |
| 6,963,090 B2 | 11/2005 | Passlack |
| 6,995,397 B2 | 2/2006 | Yamashita |
| 7,002,214 B1 | 2/2006 | Boyd |
| 7,008,836 B2 | 3/2006 | Algotsson |
| 7,015,546 B2 | 3/2006 | Herr |
| 7,015,741 B2 | 3/2006 | Tschanz |
| 7,022,559 B2 | 4/2006 | Barnak |
| 7,036,098 B2 | 4/2006 | Eleyan |
| 7,038,258 B2 | 5/2006 | Liu |
| 7,039,881 B2 | 5/2006 | Regan |
| 7,045,456 B2 | 5/2006 | Murto |
| 7,057,216 B2 | 6/2006 | Ouyang |
| 7,061,058 B2 | 6/2006 | Chakravarthi |
| 7,064,039 B2 | 6/2006 | Liu |
| 7,064,399 B2 | 6/2006 | Babcock |
| 7,071,103 B2 | 7/2006 | Chan |
| 7,078,325 B2 | 7/2006 | Curello |
| 7,078,776 B2 | 7/2006 | Nishinohara |
| 7,089,513 B2 | 8/2006 | Bard |
| 7,089,515 B2 | 8/2006 | Hanafi |
| 7,091,093 B1 | 8/2006 | Noda |
| 7,105,399 B1 | 9/2006 | Dakshina-Murthy |
| 7,109,099 B2 | 9/2006 | Tan |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch |
| 7,169,675 B2 | 1/2007 | Tan |
| 7,170,120 B2 | 1/2007 | Datta |
| 7,176,137 B2 | 2/2007 | Perug |
| 7,186,598 B2 | 3/2007 | Yamauchi |
| 7,189,627 B2 | 3/2007 | Wu |
| 7,199,430 B2 | 4/2007 | Babcock |
| 7,202,517 B2 | 4/2007 | Dixit |
| 7,208,354 B2 | 4/2007 | Bauer |
| 7,211,871 B2 | 5/2007 | Cho |
| 7,221,021 B2 | 5/2007 | Wu |
| 7,223,646 B2 | 5/2007 | Miyashita |
| 7,226,833 B2 | 6/2007 | White |
| 7,226,843 B2 | 6/2007 | Weber |
| 7,230,680 B2 | 6/2007 | Fujisawa |
| 7,235,822 B2 | 6/2007 | Li |
| 7,256,639 B1 | 8/2007 | Koniaris |
| 7,259,428 B2 | 8/2007 | Inaba |
| 7,260,562 B2 | 8/2007 | Czajkowski |
| 7,294,877 B2 | 11/2007 | Rueckes |
| 7,297,994 B2 | 11/2007 | Wieczorek |
| 7,301,208 B2 | 11/2007 | Handa |
| 7,304,350 B2 | 12/2007 | Misaki |
| 7,307,471 B2 | 12/2007 | Gammie |
| 7,312,500 B2 | 12/2007 | Miyashita |
| 7,323,754 B2 | 1/2008 | Ema |
| 7,332,439 B2 | 2/2008 | Lindert |
| 7,348,629 B2 | 3/2008 | Chu |
| 7,354,833 B2 | 4/2008 | Liaw |
| 7,380,225 B2 | 5/2008 | Joshi |
| 7,398,497 B2 | 7/2008 | Sato |
| 7,402,207 B1 | 7/2008 | Besser |
| 7,402,872 B2 | 7/2008 | Murthy |
| 7,416,605 B2 | 8/2008 | Zollner |
| 7,427,788 B2 | 9/2008 | Li |
| 7,442,971 B2 | 10/2008 | Wirbeleit |
| 7,449,733 B2 | 11/2008 | Inaba |
| 7,462,908 B2 | 12/2008 | Bol |
| 7,469,164 B2 | 12/2008 | Du-Nour |
| 7,470,593 B2 | 12/2008 | Rouh |
| 7,485,536 B2 | 2/2009 | Jin |
| 7,487,474 B2 | 2/2009 | Ciplickas |
| 7,491,988 B2 | 2/2009 | Tolchinsky |
| 7,494,861 B2 | 2/2009 | Chu |
| 7,496,862 B2 | 2/2009 | Chang |
| 7,496,867 B2 | 2/2009 | Turner |
| 7,498,637 B2 | 3/2009 | Yamaoka |
| 7,501,324 B2 | 3/2009 | Babcock |
| 7,503,020 B2 | 3/2009 | Allen |
| 7,507,999 B2 | 3/2009 | Kusumoto |
| 7,514,766 B2 | 4/2009 | Yoshida |
| 7,521,323 B2 | 4/2009 | Surdeanu |
| 7,531,393 B2 | 5/2009 | Doyle |
| 7,531,836 B2 | 5/2009 | Liu |
| 7,538,364 B2 | 5/2009 | Twynam |
| 7,538,412 B2 | 5/2009 | Schulze |
| 7,562,233 B1 | 7/2009 | Sheng |
| 7,564,105 B2 | 7/2009 | Chi |
| 7,566,600 B2 | 7/2009 | Mouli |
| 7,569,456 B2 | 8/2009 | Ko |
| 7,586,322 B1 | 9/2009 | Xu |
| 7,592,241 B2 | 9/2009 | Takao |
| 7,595,243 B1 | 9/2009 | Bulucea |
| 7,598,142 B2 | 10/2009 | Ranade |
| 7,605,041 B2 | 10/2009 | Ema |
| 7,605,060 B2 | 10/2009 | Meunier-Beillard |

(56) References Cited

U.S. PATENT DOCUMENTS

| | | |
|---|---|---|
| 7,605,429 B2 | 10/2009 | Bertsein |
| 7,608,496 B2 | 10/2009 | Chu |
| 7,615,802 B2 | 11/2009 | Elpelt |
| 7,622,341 B2 | 11/2009 | Chudzik |
| 7,638,380 B2 | 12/2009 | Pearce |
| 7,642,140 B2 | 1/2010 | Bae |
| 7,644,377 B1 | 1/2010 | Saxe |
| 7,645,665 B2 | 1/2010 | Kubo |
| 7,651,920 B2 | 1/2010 | Siprak |
| 7,655,523 B2 | 2/2010 | Babcock |
| 7,673,273 B2 | 3/2010 | Madurawe |
| 7,675,126 B2 | 3/2010 | Cho |
| 7,675,317 B2 | 3/2010 | Perisetty |
| 7,678,638 B2 | 3/2010 | Chu |
| 7,681,628 B2 | 3/2010 | Joshi |
| 7,682,887 B2 | 3/2010 | Dokumaci |
| 7,683,442 B1 | 3/2010 | Burr |
| 7,696,000 B2 | 4/2010 | Liu |
| 7,704,822 B2 | 4/2010 | Jeong |
| 7,704,844 B2 | 4/2010 | Zhu |
| 7,709,828 B2 | 5/2010 | Braithwaite |
| 7,723,750 B2 | 5/2010 | Zhu |
| 7,737,472 B2 | 6/2010 | Kondo |
| 7,741,138 B2 | 6/2010 | Cho |
| 7,741,200 B2 | 6/2010 | Cho |
| 7,745,270 B2 | 6/2010 | Shah |
| 7,750,374 B2 | 7/2010 | Capasso |
| 7,750,381 B2 | 7/2010 | Hokazono |
| 7,750,405 B2 | 7/2010 | Nowak |
| 7,750,682 B2 | 7/2010 | Bernstein |
| 7,755,144 B2 | 7/2010 | Li |
| 7,755,146 B2 | 7/2010 | Helm |
| 7,759,206 B2 | 7/2010 | Luo |
| 7,759,714 B2 | 7/2010 | Itoh |
| 7,761,820 B2 | 7/2010 | Berger |
| 7,795,677 B2 | 9/2010 | Bangsaruntip |
| 7,808,045 B2 | 10/2010 | Kawahara |
| 7,808,410 B2 | 10/2010 | Kim |
| 7,811,873 B2 | 10/2010 | Mochizuki |
| 7,811,881 B2 | 10/2010 | Cheng |
| 7,818,702 B2 | 10/2010 | Mandelman |
| 7,821,066 B2 | 10/2010 | Lebby |
| 7,829,402 B2 | 11/2010 | Matocha |
| 7,831,873 B1 | 11/2010 | Trimberger |
| 7,846,822 B2 | 12/2010 | Seebauer |
| 7,855,118 B2 | 12/2010 | Hoentschel |
| 7,859,013 B2 | 12/2010 | Chen |
| 7,863,163 B2 | 1/2011 | Bauer |
| 7,867,835 B2 | 1/2011 | Lee |
| 7,883,977 B2 | 2/2011 | Babcock |
| 7,888,205 B2 | 2/2011 | Herner |
| 7,888,747 B2 | 2/2011 | Hokazono |
| 7,895,546 B2 | 2/2011 | Lahner |
| 7,897,495 B2 | 3/2011 | Ye |
| 7,906,413 B2 | 3/2011 | Cardone |
| 7,906,813 B2 | 3/2011 | Kato |
| 7,910,419 B2 | 3/2011 | Fenouillet-Beranger |
| 7,919,791 B2 | 4/2011 | Flynn |
| 7,926,018 B2 | 4/2011 | Moroz |
| 7,935,984 B2 | 5/2011 | Nakano |
| 7,941,776 B2 | 5/2011 | Majumder |
| 7,945,800 B2 | 5/2011 | Gomm |
| 7,948,008 B2 | 5/2011 | Liu |
| 7,952,147 B2 | 5/2011 | Ueno |
| 7,960,232 B2 | 6/2011 | King |
| 7,960,238 B2 | 6/2011 | Kohli |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell |
| 7,989,900 B2 | 8/2011 | Haensch |
| 7,994,573 B2 | 8/2011 | Pan |
| 8,004,024 B2 | 8/2011 | Furukawa |
| 8,012,827 B2 | 9/2011 | Yu |
| 8,029,620 B2 | 10/2011 | Kim |
| 8,039,332 B2 | 10/2011 | Bernard |
| 8,046,598 B2 | 10/2011 | Lee |
| 8,048,791 B2 | 11/2011 | Hargrove |
| 8,048,810 B2 | 11/2011 | Tsai |
| 8,051,340 B2 | 11/2011 | Cranford, Jr. |
| 8,053,340 B2 | 11/2011 | Colombeau |
| 8,063,466 B2 | 11/2011 | Kurita |
| 8,067,279 B2 | 11/2011 | Sadra |
| 8,067,280 B2 | 11/2011 | Wang |
| 8,067,302 B2 | 11/2011 | Li |
| 8,076,719 B2 | 12/2011 | Zeng |
| 8,097,529 B2 | 1/2012 | Krull |
| 8,103,983 B2 | 1/2012 | Agarwal |
| 8,105,891 B2 | 1/2012 | Yeh |
| 8,106,424 B2 | 1/2012 | Schruefer |
| 8,106,481 B2 | 1/2012 | Rao |
| 8,110,487 B2 | 2/2012 | Griebenow |
| 8,114,761 B2 | 2/2012 | Mandrekar |
| 8,119,482 B2 | 2/2012 | Bhalla |
| 8,120,069 B2 | 2/2012 | Hynecek |
| 8,129,246 B2 | 3/2012 | Babcock |
| 8,129,797 B2 | 3/2012 | Chen |
| 8,134,159 B2 | 3/2012 | Hokazono |
| 8,143,120 B2 | 3/2012 | Kerr |
| 8,143,124 B2 | 3/2012 | Challa |
| 8,143,678 B2 | 3/2012 | Kim |
| 8,148,774 B2 | 4/2012 | Mori |
| 8,163,619 B2 | 4/2012 | Yang |
| 8,169,002 B2 | 5/2012 | Chang |
| 8,170,857 B2 | 5/2012 | Joshi |
| 8,173,499 B2 | 5/2012 | Chung |
| 8,173,502 B2 | 5/2012 | Yan |
| 8,176,461 B1 | 5/2012 | Trimberger |
| 8,178,430 B2 | 5/2012 | Kim |
| 8,179,530 B2 | 5/2012 | Levy |
| 8,183,096 B2 | 5/2012 | Wirbeleit |
| 8,183,107 B2 | 5/2012 | Mathur |
| 8,185,865 B2 | 5/2012 | Gupta |
| 8,187,959 B2 | 5/2012 | Pawlak |
| 8,188,542 B2 | 5/2012 | Yoo |
| 8,196,545 B2 | 6/2012 | Kurosawa |
| 8,201,122 B2 | 6/2012 | Dewey, III |
| 8,214,190 B2 | 7/2012 | Joshi |
| 8,217,423 B2 | 7/2012 | Liu |
| 8,225,255 B2 | 7/2012 | Ouyang |
| 8,227,307 B2 | 7/2012 | Chen |
| 8,236,661 B2 | 8/2012 | Dennard |
| 8,239,803 B2 | 8/2012 | Kobayashi |
| 8,247,300 B2 | 8/2012 | Babcock |
| 8,255,843 B2 | 8/2012 | Chen |
| 8,258,026 B2 | 9/2012 | Bulucea |
| 8,266,567 B2 | 9/2012 | El Yahyaoui |
| 8,286,180 B2 | 10/2012 | Foo |
| 8,288,798 B2 | 10/2012 | Passlack |
| 8,299,562 B2 | 10/2012 | Li |
| 8,324,059 B2 | 12/2012 | Guo |
| 2001/0014495 A1 | 8/2001 | Yu |
| 2002/0033511 A1 | 3/2002 | Babcock et al. |
| 2002/0042184 A1 | 4/2002 | Nandakumar |
| 2003/0006415 A1 | 1/2003 | Yokogawa |
| 2003/0047763 A1 | 3/2003 | Hieda |
| 2003/0122203 A1 | 7/2003 | Nishinohara |
| 2003/0173626 A1 | 9/2003 | Burr |
| 2003/0183856 A1 | 10/2003 | Wieczorek |
| 2003/0215992 A1 | 11/2003 | Sohn |
| 2004/0053457 A1 | 3/2004 | Sohn |
| 2004/0075118 A1 | 4/2004 | Heinemann |
| 2004/0075143 A1 | 4/2004 | Bae |
| 2004/0084731 A1 | 5/2004 | Matsuda |
| 2004/0087090 A1 | 5/2004 | Grudowski |
| 2004/0126947 A1 | 7/2004 | Sohn |
| 2004/0175893 A1 | 9/2004 | Vatus |
| 2004/0180488 A1 | 9/2004 | Lee |
| 2005/0056877 A1 | 3/2005 | Rueckes |
| 2005/0106824 A1 | 5/2005 | Alberto |
| 2005/0116282 A1 | 6/2005 | Pattanayak |
| 2005/0250289 A1 | 11/2005 | Babcock |
| 2005/0280075 A1 | 12/2005 | Ema |
| 2006/0017100 A1 | 1/2006 | Bol |

(56) References Cited

U.S. PATENT DOCUMENTS

| | | |
|---|---|---|
| 2006/0022270 A1 | 2/2006 | Boyd |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0091481 A1 | 5/2006 | Li |
| 2006/0154428 A1 | 7/2006 | Dokumaci |
| 2006/0157794 A1 | 7/2006 | Doyle |
| 2006/0197158 A1 | 9/2006 | Babcock |
| 2006/0203581 A1 | 9/2006 | Joshi |
| 2006/0220114 A1 | 10/2006 | Miyashita |
| 2006/0223248 A1 | 10/2006 | Venugopal |
| 2006/0273299 A1 | 12/2006 | Stephenson |
| 2007/0040222 A1 | 2/2007 | Van Camp |
| 2007/0117326 A1 | 5/2007 | Tan |
| 2007/0158790 A1 | 7/2007 | Rao |
| 2007/0212861 A1 | 9/2007 | Chidambarrao |
| 2007/0238253 A1 | 10/2007 | Tucker |
| 2008/0067589 A1 | 3/2008 | Ito |
| 2008/0079493 A1 | 4/2008 | Hamlin |
| 2008/0108208 A1 | 5/2008 | Arevalo |
| 2008/0138953 A1 | 6/2008 | Challa |
| 2008/0169493 A1 | 7/2008 | Lee |
| 2008/0169516 A1 | 7/2008 | Chung |
| 2008/0197439 A1 | 8/2008 | Goerlach |
| 2008/0227250 A1 | 9/2008 | Ranade |
| 2008/0237661 A1 | 10/2008 | Ranade |
| 2008/0258198 A1 | 10/2008 | Bojarczuk |
| 2008/0272409 A1 | 11/2008 | Sonkusale |
| 2009/0003105 A1 | 1/2009 | Itoh |
| 2009/0057746 A1 | 3/2009 | Sugll |
| 2009/0057762 A1 | 3/2009 | Bangsaruntip |
| 2009/0108350 A1 | 4/2009 | Cai |
| 2009/0121298 A1 | 5/2009 | Furukawa |
| 2009/0134468 A1 | 5/2009 | Tsuchiya |
| 2009/0224319 A1 | 9/2009 | Kohli |
| 2009/0302388 A1 | 12/2009 | Cai |
| 2009/0309140 A1 | 12/2009 | Khamankar |
| 2009/0311837 A1 | 12/2009 | Kapoor |
| 2009/0321849 A1 | 12/2009 | Miyamura |
| 2010/0012988 A1 | 1/2010 | Yang |
| 2010/0038724 A1 | 2/2010 | Anderson |
| 2010/0100856 A1 | 4/2010 | Mittal |
| 2010/0148153 A1 | 6/2010 | Hudait |
| 2010/0149854 A1 | 6/2010 | Vora |
| 2010/0187641 A1 | 7/2010 | Zhu |
| 2010/0207182 A1 | 8/2010 | Paschal |
| 2010/0270600 A1 | 10/2010 | Inukai |
| 2011/0059588 A1 | 3/2011 | Kang |
| 2011/0073961 A1 | 3/2011 | Dennard |
| 2011/0074498 A1 | 3/2011 | Thompson |
| 2011/0079860 A1 | 4/2011 | Verhulst |
| 2011/0079861 A1 | 4/2011 | Shifren |
| 2011/0095811 A1 | 4/2011 | Chi |
| 2011/0147828 A1 | 6/2011 | Murthy |
| 2011/0169082 A1 | 7/2011 | Zhu |
| 2011/0175170 A1 | 7/2011 | Wang |
| 2011/0180880 A1 | 7/2011 | Chudzik |
| 2011/0193164 A1 | 8/2011 | Zhu |
| 2011/0212590 A1 | 9/2011 | Wu |
| 2011/0230039 A1 | 9/2011 | Mowry |
| 2011/0242921 A1 | 10/2011 | Tran |
| 2011/0248352 A1 | 10/2011 | Shifren |
| 2011/0294278 A1 | 12/2011 | Eguchi |
| 2011/0309447 A1 | 12/2011 | Arghavani |
| 2012/0021594 A1 | 1/2012 | Gurtej |
| 2012/0034745 A1 | 2/2012 | Colombeau |
| 2012/0056275 A1 | 3/2012 | Cai |
| 2012/0065920 A1 | 3/2012 | Nagumo |
| 2012/0108050 A1 | 5/2012 | Chen |
| 2012/0132998 A1 | 5/2012 | Kwon |
| 2012/0138953 A1 | 6/2012 | Cai |
| 2012/0146155 A1 | 6/2012 | Hoentschel |
| 2012/0167025 A1 | 6/2012 | Gillespie |
| 2012/0168864 A1 | 7/2012 | Dennard |
| 2012/0187491 A1 | 7/2012 | Zhu |
| 2012/0190177 A1 | 7/2012 | Kim |
| 2012/0223363 A1 | 9/2012 | Kronholz |

FOREIGN PATENT DOCUMENTS

| | | |
|---|---|---|
| EP | 0274278 | 7/1988 |
| EP | 0312237 | 4/1989 |
| EP | 0531621 | 3/1993 |
| EP | 0 683 515 | 11/1995 |
| EP | 0889502 | 1/1999 |
| EP | 1 450 394 A1 | 8/2004 |
| JP | 59193066 | 11/1984 |
| JP | S63305566(A) | 12/1988 |
| JP | 4186774 | 7/1992 |
| JP | 8153873 | 6/1996 |
| JP | 1996172187 | 7/1996 |
| JP | 8288508 | 11/1996 |
| JP | H09-246534 | 9/1997 |
| JP | 2000-243958 | 9/2000 |
| JP | 2004087671 | 3/2004 |
| KR | 794094 | 1/2008 |
| WO | WO 2011/062788 | 5/2011 |

OTHER PUBLICATIONS

State Intellectual Property Office of the People's Republic of China, The First Office Action, Application No. 201180035830.2; with English language translation, 15 pages, Dated: May 6, 2014.

Japanese Office Action issued in JP Appl. No. 2013-516663; 7 pages with English translation, Apr. 21, 2015.

Banerjee, et al. "Compensating Non-Optical Effects using Electrically-Driven Optical Proximity Correction", Proc. of SPIE vol. 7275 72750E, 2009.

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Hori, et al., "A 0.1 μm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

Abiko, H et al., "A Channel Engineering Combined with Channel Epitaxy Optimization and TED Suppression for 0.15 μm n-n Gate CMOS Technology", 1995 Symposium on VLSI Technology Digest of Technical Papers, pp. 23-24, 1995.

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content Si1-yCy Channel", ECS 210th Meeting, Abstract 1033, 2006.

(56) References Cited

OTHER PUBLICATIONS

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.
Goesele, U et al., Diffusion Engineering by Carbon in Silicon, Mat. Res. Soc. Symp. vol. 610, 2000.
Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.
Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.
Holland, OW and Thomas, DK "A Method to Improve Activation of Implanted Dopants in SiC", Oak Ridge National Laboratory, Oak Ridge, TN, 2001.
Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.
Lavéant, P. "Incorporation, Diffusion and Agglomeration of Carbon in Silicon", Solid State Phenomena, vols. 82-84, pp. 189-194, 2002.
Noda, K et al., "A 0.1-µm Delta-Doped MOSFET Fabricated with Post-Low-Energy Implanting Selective Epitaxy" IEEE Transactions on Electron Devices, vol. 45, No. 4, pp. 809-814, Apr. 1998.
Ohguro, T et al., "An 0.18-µm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.
Pinacho, R et al., "Carbon in Silicon: Modeling of Diffusion and Clustering Mechanisms", Journal of Applied Physics, vol. 92, No. 3, pp. 1582-1588, Aug. 2002.
Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.
Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.
Wong, H et al., "Nanoscale CMOS", Proceedings of the IEEE, Vo. 87, No. 4, pp. 537-570, Apr. 1999.
PCT Notification of Transmittal of the International Search Report and the Written Opinion of the International Searching Authority for International Application No. PCT/US10/48998; 10 pages, Jan. 6, 2011.
PCT Notification of Transmittal of the International Search Report and the Written Opinion of the International Searching Authority for International Application No. PCT/US2010/049000; 9 pages, Jan. 12, 2011.
Shao, et al. "Boron diffusion in silicon: the anomalies and control by point defect engineering" Materials Science and Engineering R: Reports, vol. 42, No. 3-4, Nov. 1, 2003 pp. 65-114.
PCT Notification of Transmittal of the International Search Report and the Written Opinion of the International Searching Authority for International Application No. PCT/US2011/041156; dated Sep. 21, 2011; 12 pages.
Yan, et al., "Scaling the Si MOSFET: From Bulk to SOI to Bulk", IEEE Transactions on Electron Devices, IEEE Service Center, Pisacataway, NJ, US, vol. 39, No. 7, Jul. 1, 1992 pp. 1704-1710.
PCT Notification of Transmittal of the International Search Report and the Written Opinion of the International Searching Authority for International Application No. PCT/US2011/041165; dated Nov. 2, 2011; 6 pages.
USPTO Office Action for U.S. Appl. No. 12/895,695, filed Sep. 30, 2010 in the name of Lucian Shifren, et al. 27 pages, dated May 27, 2011.
USPTO Office Action for U.S. Appl. No. 12/895,695, filed Sep. 30, 2010 in the name of Lucian Shifren, et al. 30 pages, dated Oct. 24, 2011.
Robertson, LS et al., "The Effect of Impurities on Diffusion and Activation of Ion Implanted Boron in Silicon", Mat. Res. Soc. Symp. vol. 610, 2000.
Scholz, R et al., "Carbon-Induced Undersaturation of Silicon Self-Interstitials", Appl. Phys. Lett. 72(2), pp. 200-202, Jan. 1998.
Scholz, RF et al., "The Contribution of Vacancies to Carbon Out-Diffusion in Silicon", Appl. Phys. Lett., vol. 74, No. 3, pp. 392-394, Jan. 1999.
Stolk, PA et al., "Physical Mechanisms of Transient Enhanced Dopant Diffusion in Ion-Implanted Silicon", J. Appl. Phys. 81(9), pp. 6031-6050, May 1997.
Thompson, S et al., "MOS Scaling: Transistor Challenges for the 21st Century", Intel Technology Journal Q3' 1998, pp. 1-19, 1998.
Wann, C. et al., "Channel Profile Optimization and Device Design for Low-Power High-Performance Dynamic-Threshold MOSFET", IEDM 96, pp. 113-116, 1996.
Werner, P et al., "Carbon Diffusion in Silicon", Applied Physics Letters, vol. 73, No. 17, pp. 2465-2467, Oct. 1998.
Japanese Office Action issued in Appl. No. 2013-516663; 5 pages including English Concise Explanation of Office Action, Feb. 18, 2016.
Japanese Office Action issued in Appl. No. 2013-516663; 5 pages including English Concise Explanation of Office Action, Sep. 6, 2016.

\* cited by examiner

ADVANCED TRANSISTORS WITH PUNCH THROUGH SUPPRESSION

RELATED APPLICATIONS

This application is a divisional of U.S. application Ser. No. 14/188,218 filed Feb. 24, 2014 which is a divisional of Ser. No. 13/787,073 filed Mar. 6, 2013, now abandoned, which is a continuation of U.S. application Ser. No. 12/895,813 now U.S. Pat. No. 8,421,162 claiming the benefit of U.S. Provisional Application No. 61/247,300, U.S. Provisional Application No. 61/262,122, and is a CIP of U.S. application Ser. No. 12/708,497 filed Feb. 18, 2010, now U.S. Pat. No. 8,273,617, and claims benefit of U.S. Provisional Application No. 61/357,492 filed Jun. 22, 2010, the disclosure of each being incorporated by reference herein.

TECHNICAL FIELD OF THE INVENTION

This disclosure relates to structures and processes for forming advanced transistors with improved operational characteristics, including enhanced punch through suppression.

BACKGROUND OF THE INVENTION

Fitting more transistors onto a single die is desirable to reduce cost of electronics and improve their functional capability. A common strategy employed by semiconductor manufacturers is to simply reduce gate size of a field effect transistor (FET), and proportionally shrink area of the transistor source, drain, and required interconnects between transistors. However, a simple proportional shrink is not always possible because of what are known as "short channel effects". Short channel effects are particularly acute when channel length under a transistor gate is comparable in magnitude to depletion depth of an operating transistor, and include reduction in threshold voltage, severe surface scattering, drain induced barrier lowering (DIBL), source-drain punch through, and electron mobility issues.

Conventional solutions to mitigate some short channel effects can involve implantation of pocket or halo implants around the source and the drain. Halo implants can be symmetrical or asymmetrical with respect to a transistor source and drain, and typically provide a smoother dopant gradient between a transistor well and the source and drains. Unfortunately, while such implants improve some electrical characteristics such as threshold voltage rolloff and drain induced barrier lowering, the resultant increased channel doping adversely affects electron mobility, primarily because of the increased dopant scattering in the channel.

Many semiconductor manufacturers have attempted to reduce short channel effects by employing new transistor types, including fully or partially depleted silicon on insulator (SOI) transistors. SOI transistors are built on a thin layer of silicon that overlies an insulator layer, have an undoped or low doped channel that minimizes short channel effects, and do not require either deep well implants or halo implants for operation. Unfortunately, creating a suitable insulator layer is expensive and difficult to accomplish. Early SOI devices were built on insulative sapphire wafers instead of silicon wafers, and are typically only used in specialty applications (e.g. military avionics or satellite) because of the high costs. Modern SOI technology can use silicon wafers, but require expensive and time consuming additional wafer processing steps to make an insulative silicon oxide layer that extends across the entire wafer below a surface layer of device-quality single-crystal silicon.

One common approach to making such a silicon oxide layer on a silicon wafer requires high dose ion implantation of oxygen and high temperature annealing to form a buried oxide (BOX) layer in a bulk silicon wafer. Alternatively, SOI wafers can be fabricated by bonding a silicon wafer to another silicon wafer (a "handle" wafer) that has an oxide layer on its surface. The pair of wafers are split apart, using a process that leaves a thin transistor quality layer of single crystal silicon on top of the BOX layer on the handle wafer. This is called the "layer transfer" technique, because it transfers a thin layer of silicon onto a thermally grown oxide layer of the handle wafer.

As would be expected, both BOX formation or layer transfer are costly manufacturing techniques with a relatively high failure rate. Accordingly, manufacture of SOI transistors not an economically attractive solution for many leading manufacturers. When cost of transistor redesign to cope with "floating body" effects, the need to develop new SOI specific transistor processes, and other circuit changes is added to SOI wafer costs, it is clear that other solutions are needed.

Another possible advanced transistor that has been investigated uses multiple gate transistors that, like SOI transistors, minimize short channel effects by having little or no doping in the channel. Commonly known as a finFET (due to a fin-like shaped channel partially surrounded by gates), use of finFET transistors has been proposed for transistors having 28 nanometer or lower transistor gate size. But again, like SOI transistors, while moving to a radically new transistor architecture solves some short channel effect issues, it creates others, requiring even more significant transistor layout redesign than SOI. Considering the likely need for complex non-planar transistor manufacturing techniques to make a finFET, and the unknown difficulty in creating a new process flow for finFET, manufacturers have been reluctant to invest in semiconductor fabrication facilities capable of making finFETs.

BRIEF DESCRIPTION OF THE DRAWINGS

A more complete understanding of embodiments of the invention will be apparent from the detailed description taken in conjunction with the accompanying drawings wherein like reference numerals represent like parts, in which.

DETAILED DESCRIPTION OF THE INVENTION

Unlike silicon on insulator (SOI) transistors, nanoscale bulk CMOS transistors (those typically having a gate length less than 100 nanometers) are subject to significant adverse short channel effects, including body leakage through both drain induced barrier lowering (DIBL) and source drain punch through. Punch through is associated with the merging of source and drain depletion layers, causing the drain depletion layer to extend across a doped substrate and reach the source depletion layer, creating a conduction path or leakage current between the source and drain. This results in a substantial increase in required transistor electrical power, along with a consequent increase in transistor heat output and decrease in operational lifetime for portable or battery powered devices using such transistors.

Figure 1:
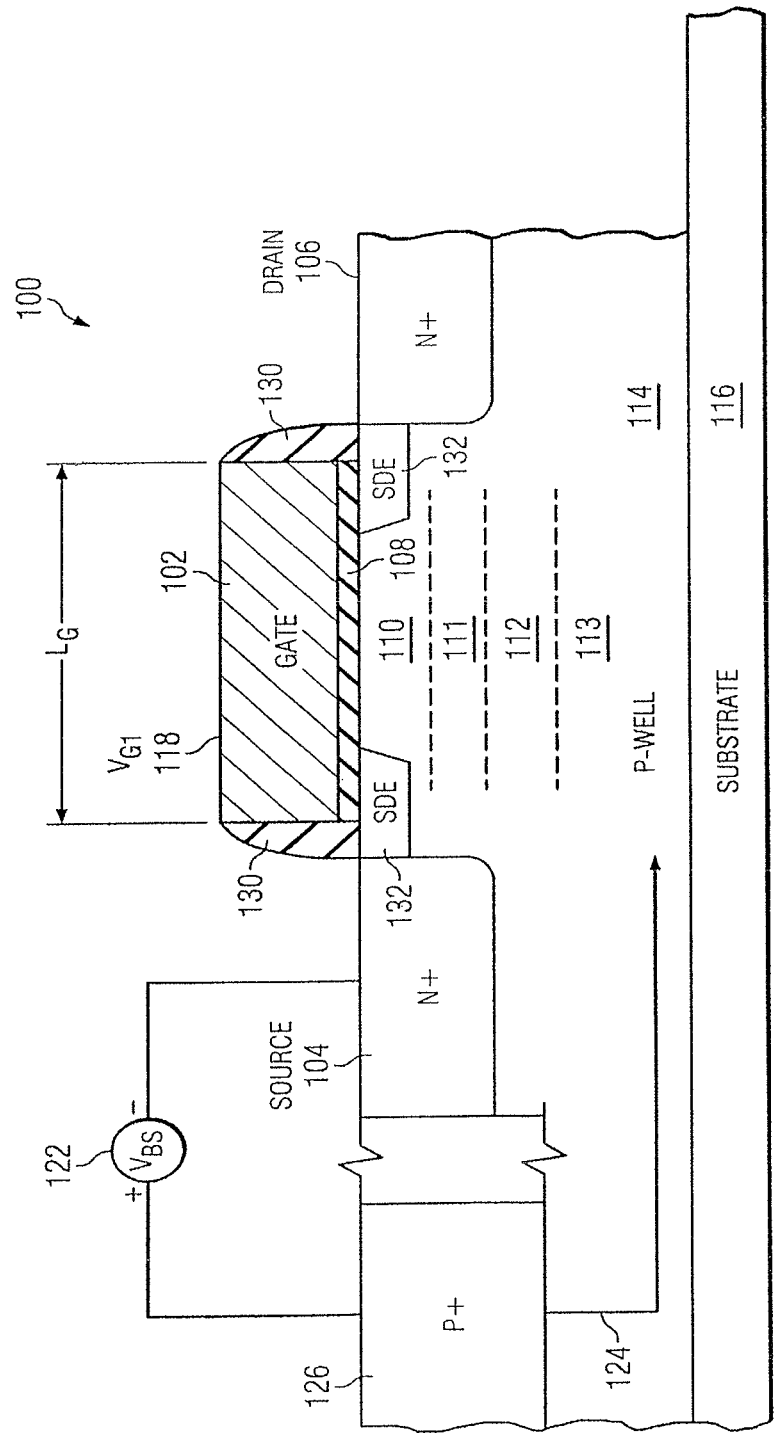
FIG. 1 illustrates a DDC transistor with a punch through suppression.

An improved transistor manufacturable on bulk CMOS substrates is seen in FIG. 1. A Field Effect Transistor (FET) 100 is configured to have greatly reduced short channel effects, along with enhanced punch through suppression according to certain described embodiments. The FET 100 includes a gate electrode 102, source 104, drain 106, and a gate dielectric 108 positioned over a channel 110. In operation, the channel 110 is deeply depleted, forming what can be described as deeply depleted channel (DDC) as compared to conventional transistors, with depletion depth set in part by a highly doped screening region 112. While the channel 110 is substantially undoped, and positioned as illustrated above a highly doped screening region 112, it may include simple or complex layering with different dopant concentrations. This doped layering can include a threshold voltage set region 111 with a dopant concentration less than screening region 112, optionally positioned between the gate dielectric 108 and the screening region 112 in the channel 110. A threshold voltage set region 111 permits small adjustments in operational threshold voltage of the FET 100, while leaving the bulk of the channel 110 substantially undoped. In particular, that portion of the channel 110 adjacent to the gate dielectric 108 should remain undoped. Additionally, a punch through suppression region 113 is formed beneath the screening region 112. Like the threshold voltage set region 111, the punch through suppression region 113 has a dopant concentration less than screening region 112, while being higher than the overall dopant concentration of a lightly doped well substrate 114.

In operation, a bias voltage 122 VBS may be applied to source 104 to further modify operational threshold voltage, and P+ terminal 126 can be connected to P-well 114 at connection 124 to close the circuit. The gate stack includes a gate electrode 102, gate contact 118 and a gate dielectric 108. Gate spacers 130 are included to separate the gate from the source and drain, and optional Source/Drain Extensions (SDE) 132, or "tips" extend the source and drain under the gate spacers and gate dielectric 108, somewhat reducing the gate length and improving electrical characteristics of FET 100.

In this exemplary embodiment, the FET 100 is shown as an N-channel transistor having a source and drain made of N-type dopant material, formed upon a substrate as P-type doped silicon substrate providing a P-well 114 formed on a substrate 116. However, it will be understood that, with appropriate change to substrate or dopant material, a non-silicon P-type semiconductor transistor formed from other suitable substrates such as Gallium Arsenide based materials may be substituted. The source 104 and drain 106 can be formed using conventional dopant implant processes and materials, and may include, for example, modifications such as stress inducing source/drain structures, raised and/or recessed source/drains, asymmetrically doped, counter-doped or crystal structure modified source/drains, or implant doping of source/drain extension regions according to LDD (low doped drain) techniques. Various other techniques to modify source/drain operational characteristics can also be used, including, in certain embodiments, use of heterogeneous dopant materials as compensation dopants to modify electrical characteristics.

The gate electrode 102 can be formed from conventional materials, preferably including, but not limited to, metals, metal alloys, metal nitrides and metal silicides, as well as laminates thereof and composites thereof. In certain embodiments the gate electrode 102 may also be formed from polysilicon, including, for example, highly doped polysilicon and polysilicon-germanium alloy. Metals or metal alloys may include those containing aluminum, titanium, tantalum, or nitrides thereof, including titanium containing compounds such as titanium nitride. Formation of the gate electrode 102 can include silicide methods, chemical vapor deposition methods and physical vapor deposition methods, such as, but not limited to, evaporative methods and sputtering methods. Typically, the gate electrode 102 has an overall thickness from about 1 to about 500 nanometers.

The gate dielectric 108 may include conventional dielectric materials such as oxides, nitrides and oxynitrides. Alternatively, the gate dielectric 108 may include generally higher dielectric constant dielectric materials including, but not limited to hafnium oxides, hafnium silicates, zirconium oxides, lanthanum oxides, titanium oxides, barium-strontium-titanates and lead-zirconate-titanates, metal based dielectric materials, and other materials having dielectric properties. Preferred hafnium-containing oxides include $HfO_2$, $HfZrO_x$, $HfSiO_x$, $HfTiO_x$, $HfAlO_x$, and the like. Depending on composition and available deposition processing equipment, the gate dielectric 108 may be formed by such methods as thermal or plasma oxidation, nitridation methods, chemical vapor deposition methods (including atomic layer deposition methods) and physical vapor deposition methods. In some embodiments, multiple or composite layers, laminates, and compositional mixtures of dielectric materials can be used. For example, a gate dielectric can be formed from a $SiO_2$-based insulator having a thickness between about 0.3 and 1 nm and the hafnium oxide based insulator having a thickness between 0.5 and 4 nm. Typically, the gate dielectric has an overall thickness from about 0.5 to about 5 nanometers.

The channel region 110 is formed below the gate dielectric 108 and above the highly doped screening region 112. The channel region 110 also contacts and extends between, the source 104 and the drain 106. Preferably, the channel region includes substantially undoped silicon having a dopant concentration less than $5 \times 10^{17}$ dopant atoms per $cm^3$ adjacent or near the gate dielectric 108. Channel thickness can typically range from 5 to 50 nanometers. In certain embodiments the channel region 110 is formed by epitaxial growth of pure or substantially pure silicon on the screening region.

As disclosed, the threshold voltage set region 111 is positioned under the gate dielectric 108, spaced therefrom, and above screening region 112, and is typically formed as a thin doped layer. Suitably varying dopant concentration, thickness, and separation from the gate dielectric and the screening region allows for controlled slight adjustments of threshold voltage in the operating FET 100. In certain embodiments, the threshold voltage set region 111 is doped to have a concentration between about $1 \times 10^{18}$ dopant atoms per cm3 and about $1 \times 10^{19}$ dopant atoms per $cm^3$. The threshold voltage set region 111 can be formed by several different processes, including 1) in-situ epitaxial doping, 2) epitaxial growth of a thin layer of silicon followed by a tightly controlled dopant implant, 3) epitaxial growth of a thin layer of silicon followed by dopant diffusion of atoms from the screening region 112, or 4) by any combination of these processes (e.g. epitaxial growth of silicon followed by both dopant implant and diffusion from the screening layer 112).

Position of a highly doped screening region 112 typically sets depth of the depletion zone of an operating FET 100. Advantageously, the screening region 112 (and associated depletion depth) are set at a depth that ranges from one comparable to the gate length (Lg/1) to a depth that is a large fraction of the gate length (Lg/5). In preferred embodiments, the typical range is between Lg/3 to Lg/1.5. Devices having an Lg/2 or greater are preferred for extremely low power operation, while digital or analog devices operating at higher voltages can often be formed with a screening region between Lg/5 and Lg/2. For example, a transistor having a gate length of 32 nanometers could be formed to have a screening region that has a peak dopant density at a depth below the gate dielectric of about 16 nanometers (Lg/2), along with a threshold voltage set region at peak dopant density at a depth of 8 nanometers (Lg/4).

In certain embodiments, the screening region 112 is doped to have a concentration between about $5 \times 10^{18}$ dopant atoms per $cm^3$ and about $1 \times 10^{20}$ dopant atoms per $cm^3$, significantly more than the dopant concentration of the undoped channel, and at least slightly greater than the dopant concentration of the optional threshold voltage set region 111. As will be appreciated, exact dopant concentrations and screening region depths can be modified to improve desired operating characteristics of FET 100, or to take in to account available transistor manufacturing processes and process conditions.

To help control leakage, the punch through suppression region 113 is formed beneath the screening region 112. Typically, the punch through suppression region 113 is formed by direct implant into a lightly doped well, but it may be formed by out-diffusion from the screening region, in-situ growth, or other known process. Like the threshold voltage set region 111, the punch through suppression region 113 has a dopant concentration less than the screening region 112, typically set between about $1 \times 10^{18}$ dopant atoms per $cm^3$ and about $1 \times 10^{19}$ dopant atoms per $cm^3$. In addition, the punch through suppression region 113 dopant concentration is set higher than the overall dopant concentration of the well substrate. As will be appreciated, exact dopant concentrations and depths can be modified to improve desired operating characteristics of FET 100, or to take in to account available transistor manufacturing processes and process conditions.

Forming such a FET 100 is relatively simple compared to SOI or finFET transistors, since well developed and long used planar CMOS processing techniques can be readily adapted.

Together, the structures and the methods of making the structures allow for FET transistors having both a low operating voltage and a low threshold voltage as compared to conventional nanoscale devices. Furthermore, DDC transistors can be configured to allow for the threshold voltage to be statically set with the aid of a voltage body bias generator. In some embodiments the threshold voltage can even be dynamically controlled, allowing the transistor leakage currents to be greatly reduced (by setting the voltage bias to upwardly adjust the $V_T$ for low leakage, low speed operation), or increased (by downwardly adjusting the $V_T$ for high leakage, high speed operation). Ultimately, these structures and the methods of making structures provide for designing integrated circuits having FET devices that can be dynamically adjusted while the circuit is in operation. Thus, transistors in an integrated circuit can be designed with nominally identical structure, and can be controlled, modulated or programmed to operate at different operating voltages in response to different bias voltages, or to operate in different operating modes in response to different bias voltages and operating voltages. In addition, these can be configured post-fabrication for different applications within a circuit.

As will be appreciated, concentrations of atoms implanted or otherwise present in a substrate or crystalline layers of a semiconductor to modify physical and electrical characteristics of a semiconductor are be described in terms of physical and functional regions or layers. These may be understood by those skilled in the art as three-dimensional masses of material that have particular averages of concentrations. Or, they may be understood as sub-regions or sub-layers with different or spatially varying concentrations. They may also exist as small groups of dopant atoms, regions of substantially similar dopant atoms or the like, or other physical embodiments. Descriptions of the regions based on these properties are not intended to limit the shape, exact location or orientation. They are also not intended to limit these regions or layers to any particular type or number of process steps, type or numbers of layers (e.g., composite or unitary), semiconductor deposition, etch techniques, or growth techniques utilized. These processes may include epitaxially formed regions or atomic layer deposition, dopant implant methodologies or particular vertical or lateral dopant profiles, including linear, monotonically increasing, retrograde, or other suitable spatially varying dopant concentration. To ensure that desired dopant concentrations are maintained, various dopant anti-migration techniques are contemplated, including low temperature processing, carbon doping, in-situ dopant deposition, and advanced flash or other annealing techniques. The resultant dopant profile may have one or more regions or layers with different dopant concentrations, and the variations in concentrations and how the regions or layers are defined, regardless of process, may or may not be detectable via techniques including infrared spectroscopy, Rutherford Back Scattering (RBS), Secondary Ion Mass Spectroscopy (SIMS), or other dopant analysis tools using different qualitative or quantitative dopant concentration determination methodologies.

Figure 2:
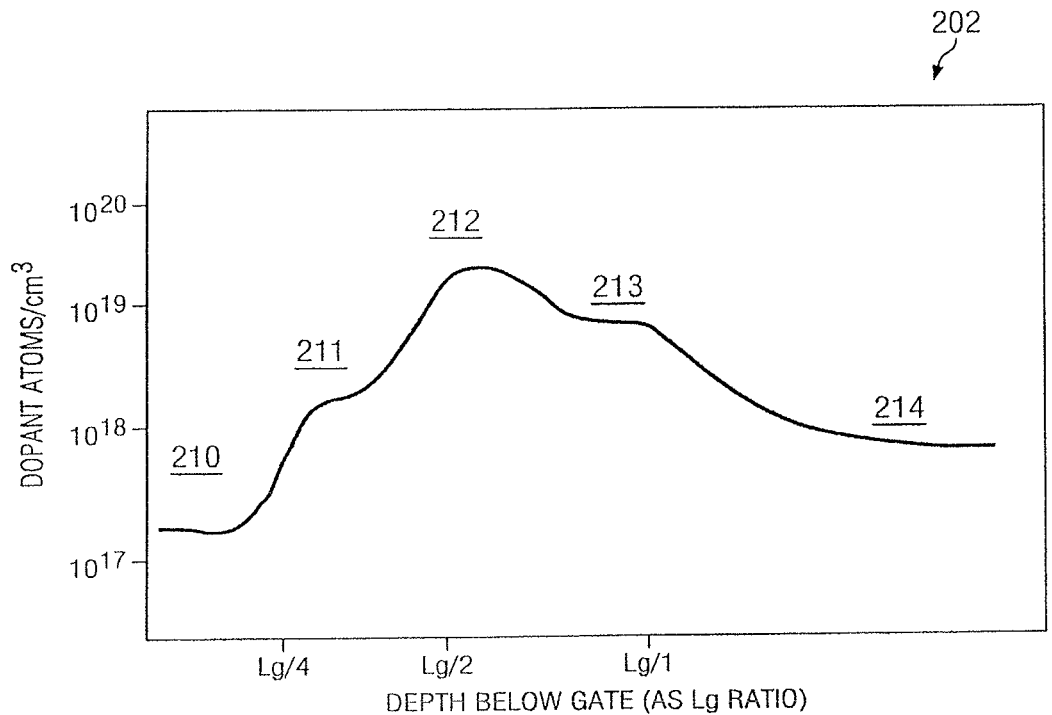
FIG. 2 illustrates a dopant profile of a DDC transistor with enhanced punch through suppression.

To better appreciate one possible transistor structure, FIG. 2 illustrates a dopant profile 202 of a deeply depleted transistor taken at midline between a source and drain, and extending downward from a gate dielectric toward a well. Concentration is measured in number of dopant atoms per cubic centimeter, and downward depth is measured as a ratio of gate length Lg. Measuring as a ratio rather than absolute depth in nanometers better allows cross comparison between transistors manufactured at different nodes (e.g. 45 nm, 32 nm, 22 nm, or 15 nm) where nodes are commonly defined in term of minimum gate lengths.

As seen in FIG. 2, the region of the channel 210 adjacent to the gate dielectric is substantially free of dopants, having less than $5 \times 10^{17}$ dopant atoms per $cm^3$ to a depth of nearly Lg/4. A threshold voltage set region 211 increases the dopant concentration to about $3 \times 10^{18}$ dopant atoms per $cm^3$, and the concentration increases another order of magnitude above $3 \times 10^{18}$ dopant atoms per $cm^3$ to form the screening region 212 that sets the base of the depletion zone in an operating transistor. A punch through suppression region 213 having a dopant concentration of about $1 \times 10^{19}$ dopant atoms per $cm^3$ at a depth of about Lg/1 is intermediate between the screening region and the lightly doped well 214. Without the punch through suppression region, a transistor constructed to have, for example, a 30 nm gate length and an operating voltage of 1.0 volts would be expected to have significantly greater leakage. When the disclosed punch through suppression region is implanted, punch through leakage is reduced, making the transistor more power efficient, and better able to tolerate process variations in transistor structure without punch through failure.

This is better seen with respect to the following Table 1, which indicates expected performance improvements for a range of punch through dosage and threshold voltage:

TABLE 1

|  | Ioff (nA/um) | Idsat (mA/um) | Vt (V) |
| --- | --- | --- | --- |
| Target Punchthrough layer | 2 | 0.89 | 0.31 |
| No Punchthrough layer | 70 | 1 | 0.199 |
| Higher Dose Punchthrough | 0.9 | 0.54 | 0.488 |
| Very deep Punchthrough | 15 | 1 | 0.237 |

Figure 3:
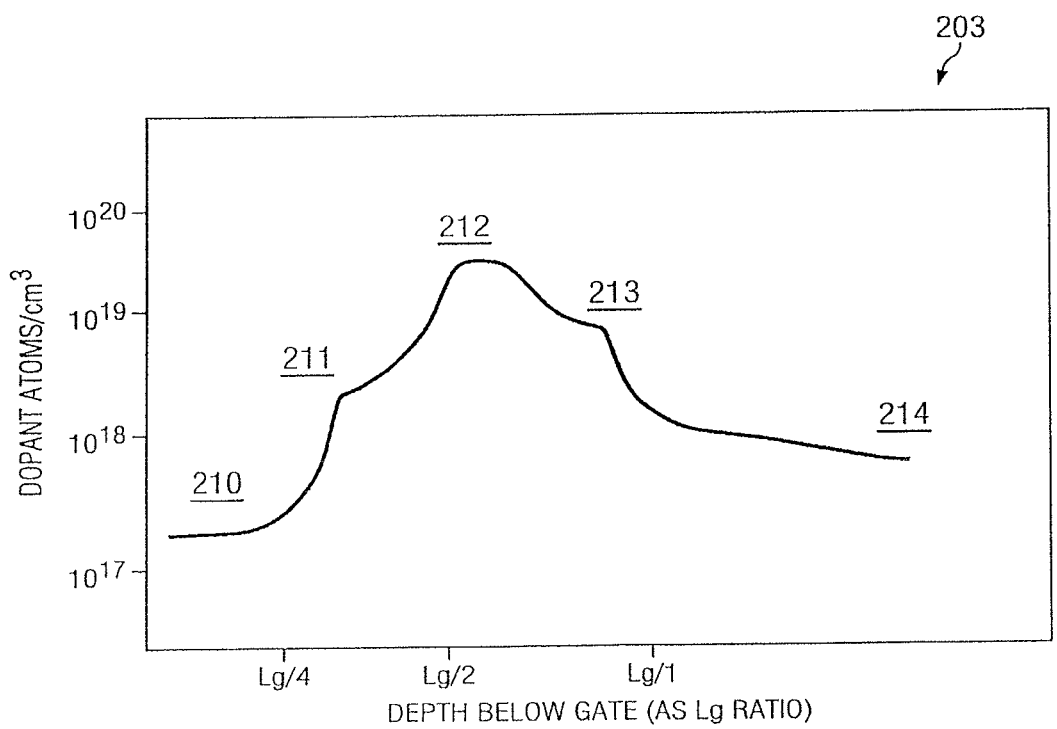
FIGS. 3-7 illustrate alternative useful dopant profiles.

Alternative dopant profiles are contemplated. As seen in FIG. 3, an alternative dopant profile 203 that includes a slightly increased depth for the low doped channel is shown. In contrast to the embodiments of FIG. 2, the threshold voltage set region 211 is a shallow notch primarily formed by out-diffusion into an epitaxially deposited layer of silicon from the screening region 212. The screening region 212 itself is set to have a dopant concentration greater than $3 \times 10^{19}$ dopant atoms per cm$^3$. The punch through suppression region 213 has a dopant concentration of about $8 \times 10^{18}$ dopant atoms per cm$^3$, provided by a combination of out-diffusion from the screening region 212 and a separate low energy implant.

Figure 4:
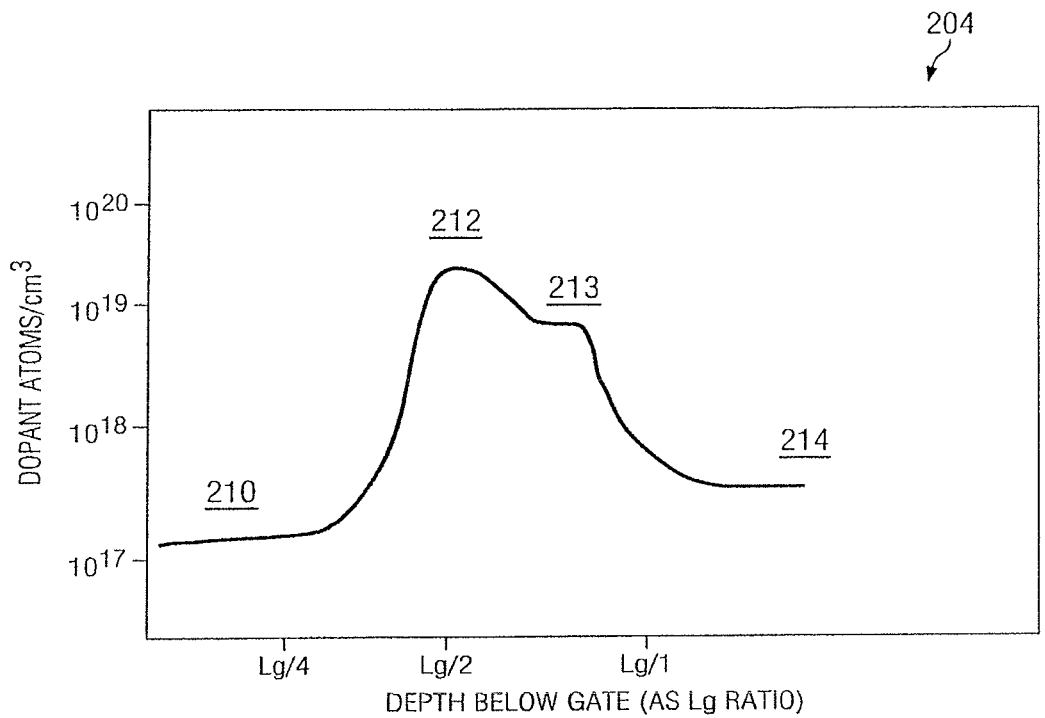

As seen in FIG. 4, an alternative dopant profile 204 that includes a greatly increased depth for the low doped channel is shown. In contrast to the embodiments of FIGS. 2 and 3, there is no distinct notch, plane or layer to aid in threshold voltage setting. The screening region 212 is set to be greater than $3 \times 10^{19}$ dopant atoms per cm$^3$ and the punch through suppression region 213 has a similarly high, yet narrowly defined dopant concentration of about $8 \times 10^{18}$ dopant atoms per cm$^3$, provided by with a separate low energy implant.

Figure 5:
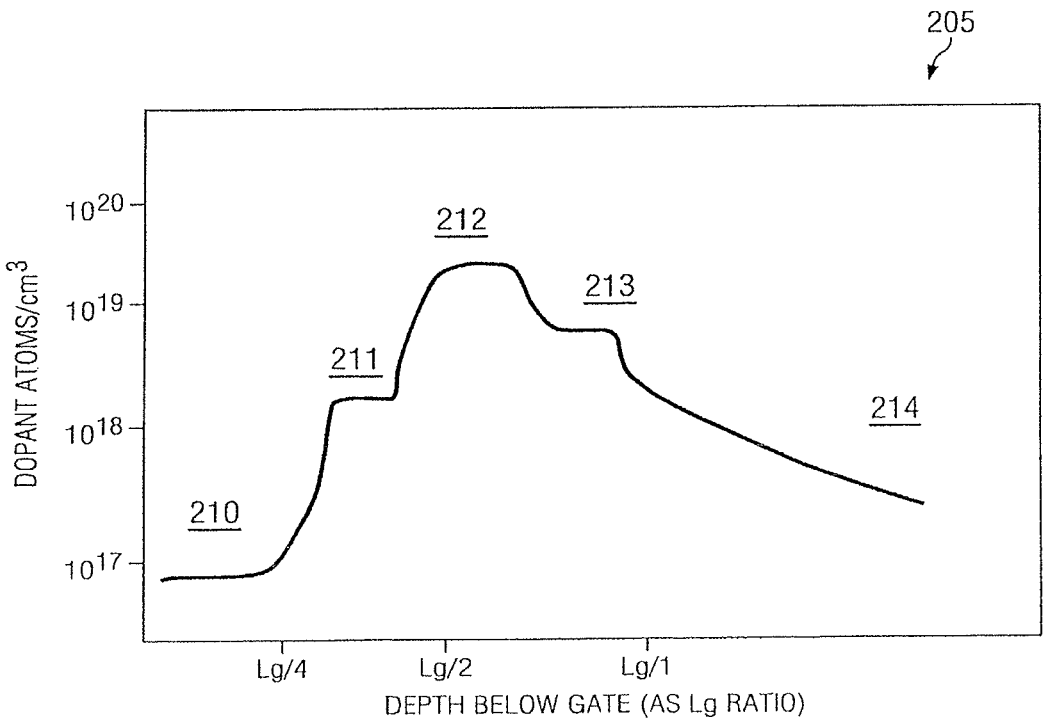

Yet another variation in dopant profile is seen in FIG. 5, which illustrates a transistor dopant profile 205 for a transistor structure that includes a very low doped channel 210. The threshold voltage set region 211 is precisely formed by in-situ or well controlled implant doping of thin epitaxial layer grown on the screening region. The screening region 212 is set to be about $1 \times 10^{19}$ dopant atoms per cm$^3$ and the punch through suppression region 213 also has narrowly defined dopant concentration of about $8 \times 10^{18}$ dopant atoms per cm$^3$, provided by with a separate low energy implant. The well implant 214 concentration is gradually reduced to about $5 \times 10^{17}$ dopant atoms per cm$^3$.

Figure 6:
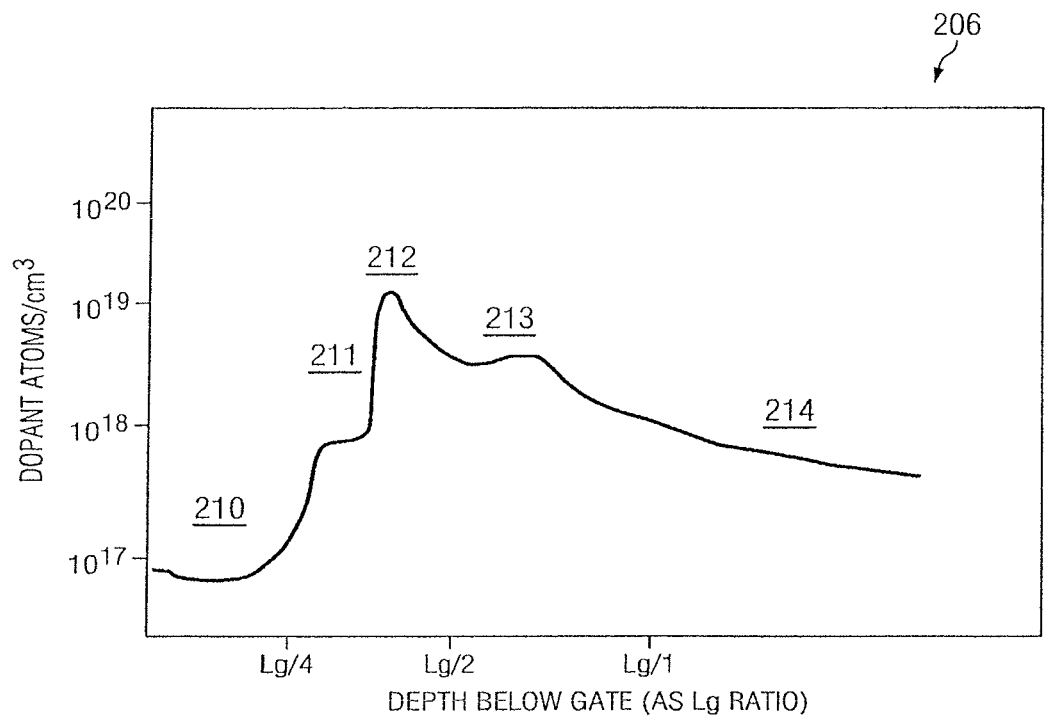

As seen in FIG. 6, a dopant profile 206 includes a low doped channel 210 adjacent to the gate dielectric, and a narrowly defined threshold voltage set region 211. The screening region 212 increases to a narrow peak set to be about $1 \times 10^{19}$ dopant atoms per cm$^3$ and the punch through suppression region 213 also has broadly peak dopant concentration of about $5 \times 10^{18}$ dopant atoms per cm$^3$, provided by with a separate low energy implant. The well implant 214 concentration is high to improve bias coefficient of the transistor, with a concentration of about $8 \times 10^{17}$ dopant atoms per cm$^3$.

Figure 7:
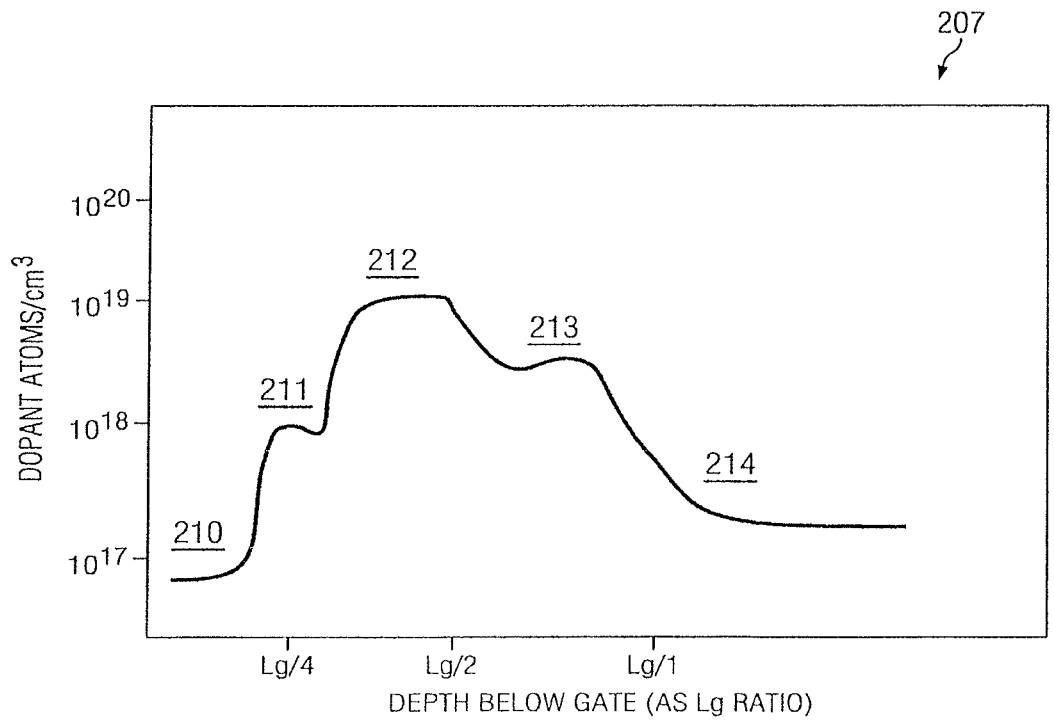

In contrast to the narrow screen region peak dopant concentration of FIG. 6, the dopant profile 207 of FIG. 7 has a broad peak 212. In addition to a narrow undoped channel 210, the transistor structure includes a well defined partially retrograde threshold set 211, and a distinct separate punch through suppression peak 213. The well 214 doping concentration is relatively low, less than about $5 \times 10^{17}$ dopant atoms per cm$^3$.

Figure 8:
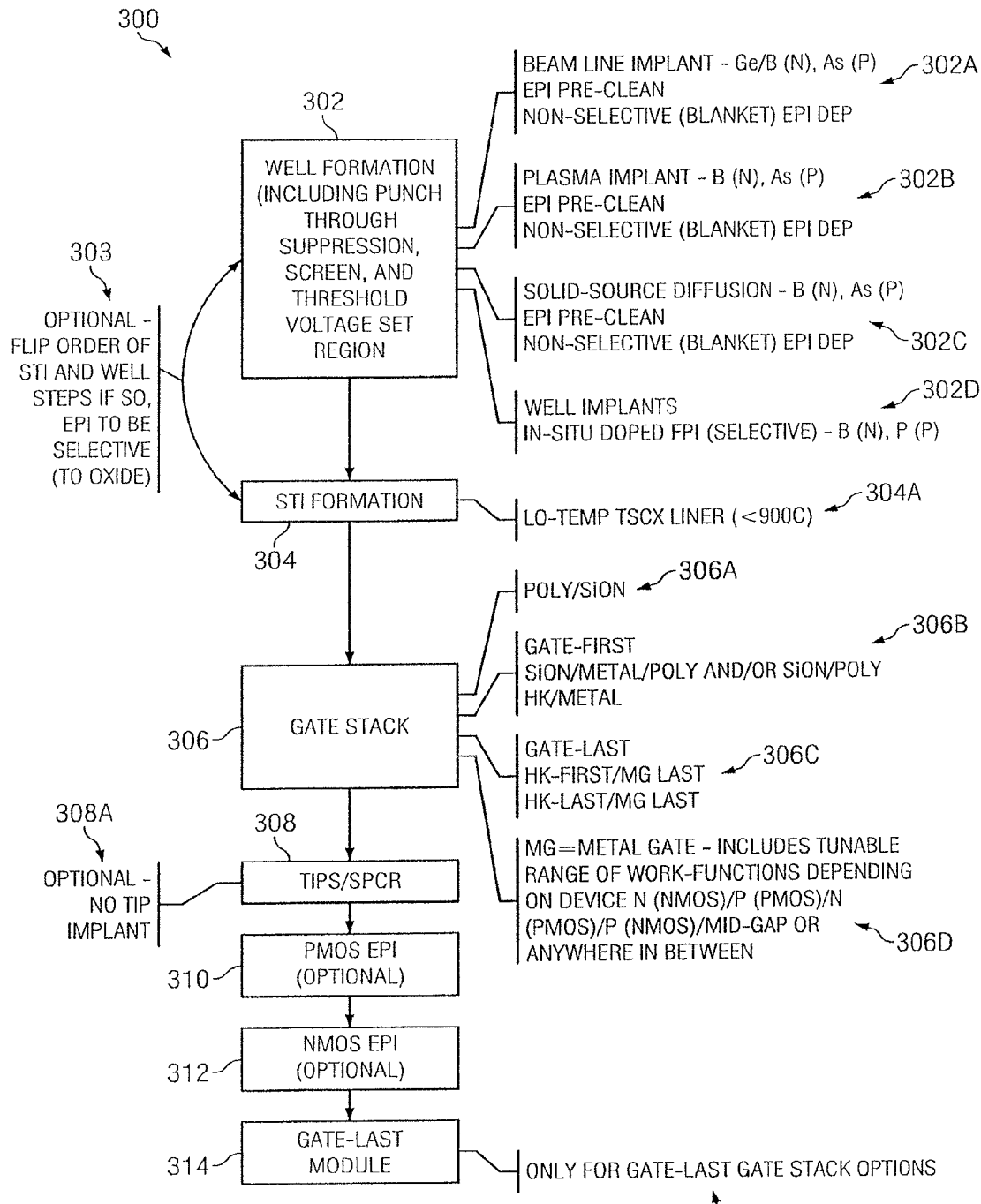
FIG. 8 is a flow diagram illustrating one exemplary process for forming a DDC transistor with a punch through suppression.

FIG. 8 is a schematic process flow diagram 300 illustrating one exemplary process for forming a transistor with a punch through suppression region and a screening region suitable for different types of FET structures, including both analog and digital transistors. The process illustrated here is intended to be general and broad in its description in order not to obscure the inventive concepts, and more detailed embodiments and examples are set forth below. These along with other process steps allow for the processing and manufacture of integrated circuits that include DDC structured devices together with legacy devices, allowing for designs to cover a full range of analog and digital devices with improved performance and lower power.

In Step 302, the process begins at the well formation, which may be one of many different processes according to different embodiments and examples. As indicated in 303, the well formation may be before or after STI (shallow trench isolation) formation 304, depending on the application and results desired. Boron (B), indium (I) or other P-type materials may be used for P-type implants, and arsenic (As) or phosphorous (P) and other N-type materials may be used for N-type implants. For the PMOS well implants, the P+ implant may be implanted within a range from 10 to 80 keV, and at NMOS well implants, the boron implant B+ implant may be within a range of 0.5 to 5 keV, and within a concentration range of $1 \times 10^{23}$ to $8 \times 10^{13}$/cm$^2$. A germanium implant Ge+, may be performed within a range of 10 to 60 keV, and at a concentration of $1 \times 10^{14}$ to $5 \times 10^{14}$/cm$^2$. To reduce dopant migration, a carbon implant, C+ may be performed at a range of 0.5 to 5 keV, and at a concentration of $1 \times 10^{13}$ to $8 \times 10^{13}$/cm$^2$. Well implants may include sequential implant, and/or epitaxial growth and implant, of punch through suppression regions, screen regions having a higher dopant density than the punch through suppression region, and threshold voltage set regions (which previously discussed are typically formed by implant or diffusion of dopants into a grown epitaxial layer on the screening region).

In some embodiments the well formation 302 may include a beam line implant of Ge/B (N), As (P), followed by an epitaxial (EPI) pre-clean process, and followed finally non-selective blanket EPI deposition, as shown in 302A. Alternatively, the well may be formed using a plasma implant of B (N), As (P), followed by an EPI pre-clean, then finally a non-selective (blanket) EPI deposition, 302B. The well formation may alternatively include a solid-source diffusion of B(N), As(P), followed by an EPI pre-clean, and followed finally by a non-selective (blanket) EPI deposition, 302C. The well formation may alternatively include a solid-source diffusion of B (N), As (P), followed by an EPI pre-clean, and followed finally by a non-selective (blanket) EPI deposition, 302D. As yet another alternative, well formation may simply include well implants, followed by in-situ doped selective EPI of B (N), P (P). Embodiments described herein allow for anyone of a number of devices configured on a common substrate with different well structures and according to different parameters.

Shallow trench isolation (STI) formation 304, which, again, may occur before or after well formation 302, may include a low temperature trench sacrificial oxide (TSOX) liner 304A at a temperature lower than 900° C. The gate stack 306 may be formed or otherwise constructed in a number of different ways, from different materials, and of different work functions. One option is a poly/SiON gate stack 306A. Another option is a gate-first process 306B that includes SiON/Metal/Poly and/or SiON/Poly, followed by High-K/Metal Gate. Another option, a gate-last process 306C includes a high-K/metal gate stack wherein the gate stack can either be formed with "Hi-K first-Metal gate last" flow or and "Hi-K last-Metal gate last" flow. Yet another option, 306D is a metal gate that includes a tunable range of work functions depending on the device construction, N(NMOS)/P(PMOS)N(PMOS)/P(NMOS)/Mid-gap or anywhere in between. In one example, N has a work function (WF) of 4.05 V±200 mV, and P has a WF of 5.01 V±200 mV.

Next, in Step 308, Source/Drain tips may be implanted, or optionally may not be implanted depending on the application. The dimensions of the tips can be varied as required, and will depend in part on whether gate spacers (SPCR) are used. In one option, there may be no tip implant in 308A. Next, in optional steps 310 and 312, PMOS or NMOS EPI layers may be formed in the source and drain regions as performance enhancers for creating strained channels. For gate-last gate stack options, in Step 314, a Gate-last module is formed. This may be only for gate-last processes 314A.

Die supporting multiple transistor types, including those with and without a punch through suppression, those having different threshold voltages, and with and without static or dynamic biasing are contemplated. Systems on a chip (SoC), advanced microprocessors, radio frequency, memory, and other die with one or more digital and analog transistor configurations can be incorporated into a device using the methods described herein. According to the methods and processes discussed herein, a system having a variety of combinations of DDC and/or transistor devices and structures with or without punch through suppression can be produced on silicon using bulk CMOS. In different embodiments, the die may be divided into one or more areas where dynamic bias structures, static bias structures or no-bias structures exist separately or in some combination. In a dynamic bias section, for example, dynamically adjustable devices may exist along with high and low $V_T$ devices and possibly DDC logic devices.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

Accordingly, the specification and drawings are to be regarded in an illustrative rather than a restrictive sense.

Although the present invention and its advantages have been described in detail, it should be understood that various changes, substitutions, and alterations can be made therein without departing from the spirit and scope of the invention as defined by the appended claims.

What is claimed is:

1. A die, comprising:
   a substrate that is a single crystal of semiconductor material;
   a first field effect transistor structure and a second field effect transistor structure, each supported by the substrate;
   wherein the first field effect transistor structure has a first gate, a first source, a first drain, and a first plurality of distinct doped regions underlying the first gate and extending between the first source and the first drain, the first plurality of doped regions implanted to define a first dopant profile of p-type, the first dopant profile having a p-type peak dopant concentration at a first depth from the first gate, a first p-type intermediate dopant concentration at a second depth from the first gate, the first p-type intermediate dopant concentration being lower than the p-type peak dopant concentration;
   wherein the first field effect transistor structure includes a first channel region formed by an undoped blanket epitaxial growth, the first channel region being directly on a first threshold voltage control region formed in the single crystal of the single semiconductor material, the first threshold voltage control region associated with the first intermediate dopant concentration,
   wherein the second field effect transistor structure has a second gate, a second source, a second drain, and a second plurality of distinct doped regions underlying the second gate and extending between the second source and the second drain, the second plurality of doped regions implanted to define a second dopant profile of n-type, the second dopant profile having a n-type peak dopant concentration at a third depth from the second gate, a first n-type intermediate dopant concentration at a fourth depth from the second gate, the first n-type intermediate dopant concentration being lower than the n-type peak dopant concentration;
   wherein the second field effect transistor structure includes a second channel region commonly formed by the undoped blanket epitaxial growth, the second channel region being directly on a second threshold voltage control region formed in the single crystal of the single semiconductor material, the second threshold voltage control region associated with the first n-type intermediate dopant concentration.

2. The die of claim 1, wherein the first dopant profile includes a second p-type intermediate dopant concentration at a fifth depth from the first gate, the second p-type intermediate dopant concentration is higher than the first p-type intermediate dopant concentration, wherein the second dopant profile includes a second n-type intermediate dopant concentration at a sixth depth from the second gate, the second n-type intermediate dopant concentration is higher than the first n-type intermediate dopant concentration.

3. The die of claim 1, wherein the p-type peak dopant concentration at the first depth sets a first depletion depth for the first field effect transistor structure when a first voltage is applied to the first gate, wherein the n-type peak dopant concentration at the third depth sets a second depletion depth for the second field effect transistor structure when a second voltage is applied to the second gate.

4. The die of claim 1, further comprising:
   a first bias structure coupled to the first source of the first field effect transistor structure, the first bias structure operable to modify a first operational threshold voltage of the first field effect transistor structure, a second bias structure coupled to the second source of the second field effect transistor structure, the second bias structure operable to modify a second operational threshold voltage of the second field effect transistor structure.

5. The die of claim 4, further comprising:
   a first fixed voltage source coupled to the first bias structure to statically set the first threshold voltage of the first field effect transistor structure and a second fixed voltage source coupled to the second bias structure to statically set the second threshold voltage of the second field effect transistor structure.

6. The die of claim 4, further comprising:
a first variable voltage source coupled to the first bias structure to dynamically adjust the first threshold voltage of the first field effect transistor structure and a second variable voltage source coupled to the second bias structure to dynamically adjust the second threshold voltage of the second field effect transistor structure.

7. The die of claim 4, wherein the first field effect transistor structure and the second field effect transistor structure are separated into different bias sections, a first bias section providing no threshold voltage adjustment, a second bias section operable to provide static threshold voltage adjustment, and a third bias section operable to provide dynamic threshold voltage adjustment.

8. The die of claim 7, wherein the different bias sections have different threshold voltages with or without any adjustment.

9. The die of claim 1, wherein the first depth is deeper below the first gate than the second depth, the third depth is deeper below the second gate than the fourth depth.

10. The die of claim 1, wherein the first depth is in a range between one half and one fifth of a length of the first gate and the third depth is in a range between one half and one fifth of a length of the second gate.

11. The die of claim 1, wherein each of the first plurality of doped regions and the second plurality of doped regions are formed in the substrate.

12. The die of claim 1, wherein each of the first plurality of doped regions and the second plurality of doped regions are formed on the substrate.

13. The die of claim 1, further comprising:
first source and drain extensions extending into the first channel region of the first field effect transistor structure and second source and drain extensions extending into the second channel region of the second field effect transistor structure.

14. The die of claim 1, wherein the first plurality of doped regions are in contact with the first source and the first drain and the second plurality of doped regions are in contact with the second source and the second drain.

15. The die of claim 1, wherein the first dopant profile has a first dopant concentration at a first point between the first depth and the second depth, the first dopant concentration being less than or equal to the first p-type intermediate dopant concentration to establish a first p-type notch in the first dopant profile, the second dopant profile has a second dopant concentration at a second point between the third depth and the fourth depth, the second dopant concentration being less than or equal to the first n-type intermediate dopant concentration to establish a first n-type notch in the second dopant profile.

16. The die of claim 2, wherein the first dopant profile has a third dopant concentration at a third point between the first depth and the fifth depth, the third dopant concentration being less than or equal to the second p-type intermediate dopant concentration to establish a second p-type notch in the first dopant profile, the second dopant profile has a fourth dopant concentration at a fourth point between the third depth and the sixth depth, the fourth dopant concentration being less than or equal to the second n-type intermediate dopant concentration to establish a second n-type notch in the second dopant profile.

17. The die of claim 2, wherein the second p-type intermediate dopant concentration is associated with a p-type suppression of punch through region of the first field effect transistor structure and the second n-type intermediate dopant concentration is associated with a n-type suppression of punch through region of the second field effect transistor structure.

18. The die of claim 2, wherein the fifth depth is deeper below the first gate than the first depth and the sixth depth is deeper below the second gate than the third depth.

* * * * *